United States Patent
Antonesei et al.

(10) Patent No.: US 9,217,766 B2
(45) Date of Patent: Dec. 22, 2015

(54) APPARATUS AND METHOD FOR MEASURING ACTIVE/REACTIVE POWERS

(75) Inventors: Gabriel Antonesei, Woburn, MA (US); Jianbo He, Hai Dian District (CN)

(73) Assignee: ANALOG DEVICES, INC., Norwood, MA (US)

( * ) Notice: Subject to any disclaimer, the term of this patent is extended or adjusted under 35 U.S.C. 154(b) by 738 days.

(21) Appl. No.: 13/211,482

(22) Filed: Aug. 17, 2011

(65) Prior Publication Data

US 2013/0046663 A1 Feb. 21, 2013

(51) Int. Cl.
*G06Q 50/06* (2012.01)
*G01R 31/04* (2006.01)
*G01R 21/00* (2006.01)
*G01R 21/133* (2006.01)

(52) U.S. Cl.
CPC .............. *G01R 31/04* (2013.01); *G01R 21/002* (2013.01); *G01R 21/003* (2013.01); *G01R 21/133* (2013.01)

(58) Field of Classification Search
CPC ................. H02J 3/00; H02J 3/01; H02J 3/16; H02J 3/18; H02M 1/12; G01R 21/1331; G01R 19/2513; G01R 21/002; G01R 21/003; G01R 21/10; G01R 21/133; G01R 31/04; G01R 35/00; G05F 1/70
See application file for complete search history.

(56) References Cited

U.S. PATENT DOCUMENTS

| | | | |
|---|---|---|---|
| 4,131,847 | A | 12/1978 | Kohga et al. |
| 4,300,182 | A | 11/1981 | Schweitzer et al. |
| 2005/0225469 | A1 | 10/2005 | White |
| 2007/0233406 | A1 | 10/2007 | Delmerico |
| 2009/0292848 | A1 | 11/2009 | Robinson et al. |
| 2010/0088049 | A1 | 4/2010 | Lu et al. |

OTHER PUBLICATIONS

Kawagoe, J.; Tsuchiyama, T.; So, E., "A Digital System for Calibrating Active/Reactive Power and Energy Meters," Precision Electromagnetic Measurements Digest, 2004 Conference on , vol., No., pp. 293,294, Jun. 2004.*
PCT International Search Report and Written Opinion from PCT/US2012/045896, mailed on Sep. 17, 2012.

* cited by examiner

*Primary Examiner* — Michael Harrington
(74) *Attorney, Agent, or Firm* — Kenyon & Kenyon LLP

(57) ABSTRACT

A device and method for measuring active and reactive powers of an alternating current includes receiving a first signal representing a current and a second signal representing a voltage, in which the current includes a phase offset with respect to the voltage, calculating an active power and reactive power based on the first and second signals, and calibrating the calculated active and reactive powers with respect to the phase offset using first and second constants, in which the first and second constants respectively correspond to a sine value and a cosine value of the phase offset.

20 Claims, 5 Drawing Sheets

APPARATUS AND METHOD FOR MEASURING ACTIVE/REACTIVE POWERS

FIELD OF THE INVENTION

The present invention is generally directed to a device and method for measuring power in an electrical power system. In particular, the present invention is directed to a device and method for calibrating the phase of active and reactive powers at different frequencies.

BACKGROUND INFORMATION

Electricity is commonly delivered from electricity suppliers to consumers in the form of alternating current (AC) at a certain fundamental frequency, e.g., 60 Hz in the U.S. The consumption of electricity, e.g., three-phase AC, is commonly measured by power meters. It is known that when the load of a power supply system includes non-linear components, the electrical power supply includes harmonic frequencies other than the fundamental frequency. Additionally, when the load is not purely resistive, the waveform of voltage V may lead or lag the waveform of current I in time or have a phase offset in the frequency domain.

Electrical power may include three components: apparent power ($P_{app}$), active power ($P_{act}$), and reactive power ($P_{react}$). The apparent power $P_{app}$ is defined as the product of magnitudes of voltage V and current I, i.e., P=V×I. The active power $P_{act}$ is defined as the capacity of the load at a particular time or the energy that flows from power source to the load. The reactive power $P_{reactive}$ is defined as the energy that is bounced back from the load to the source. If the phase offset between current and voltage in frequency is $\phi$, then $P_{act}=P_{app}*|\cos(\phi)|$ and $P_{react}=P_{app}*|\sin(\phi)|$.

DETAILED DESCRIPTION OF EXAMPLE EMBODIMENTS

Figure 1:
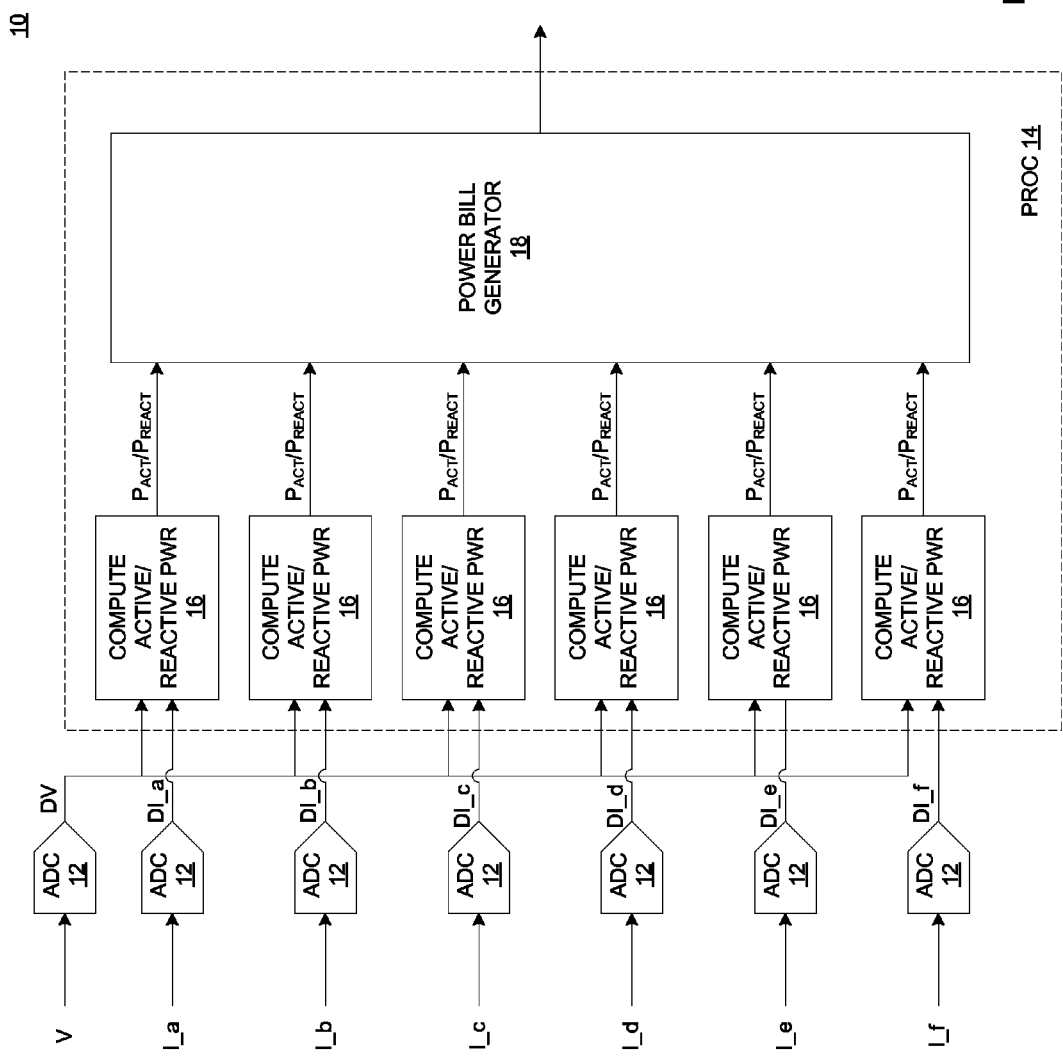
FIG. 1 illustrates a system diagram of a power meter.

In practice, the electrical powers including active and reactive powers may be measured using a power meter. FIG. 1 illustrates a system diagram of a power meter 10. As shown in FIG. 1, the power meter 10 may receive one voltage measurement V and six channels of current measurements I_a, . . . , I_f so that the power meter 10 may concurrently measure the powers for the six AC inputs. Thus, the power meter includes six meter channels each measuring the power going through one current path. The power meter may include analog-to-digital converters (ADC) 12 and a processor 14 such as a DSP. ADCs 12 may convert the measured voltage V and each of the six measured currents I_a, . . . , I_f into respective digital signals DV, DI_a, . . . , DI_f that correspondingly represent the measured voltage input and the six measured current inputs in a digital domain. Processor 14 may be configured to include modules 16 each receiving the digitized voltage DV and one of the six digitized currents to compute active and reactive powers. The computed results from modules 16 may include apparent, active, and reactive powers at the fundamental frequency and harmonic frequencies. Further, processor 14 may be configured to include another module 18 for generating a final power bill to customers based on the computed active and reactive powers.

Figure 2:
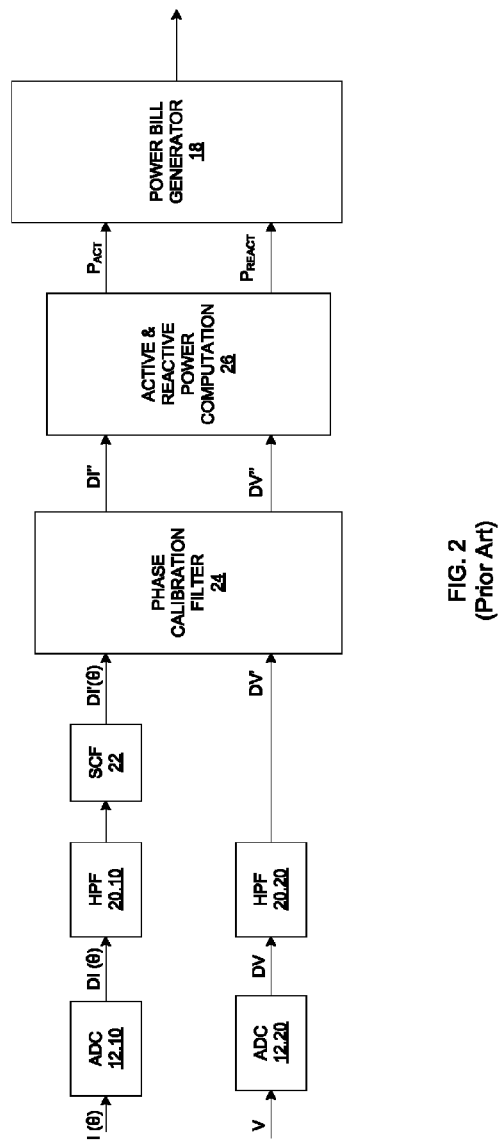
FIG. 2 illustrates an exemplary meter channel in a power meter with current phase calibration.

One problem with power meter 10 is that current transformers embedded in the current transmission lines cause additional delays in the time domain (or phase offsets in the frequency domain) in the current with respect to the voltage. Current art compensates these additional phase offsets of current prior to computing active and reactive powers. FIG. 2 illustrates an exemplary meter channel that tries to calibrate the current I with the corresponding voltage V for removing (or substantially reducing) the additional phase offsets caused by current transformers in transmission lines. The meter channel includes a first signal path for receiving the measured current I and a second signal path for receiving the measured voltage V. The input current I during the transmission to the meter channel may pass through current transformers (not shown) that cause an added phase offset of $\theta$ with respect to the voltage V. Thus, the current $I(\theta)$ includes the additional phase offset with respect to the voltage V prior to the power meter. For the meter channel, the current signal path may include an ADC 12.10, a high-pass filter 20.10, and a sensor compensation filter 22, while the voltage signal path may include an ADC 12.20 and a high path filter 20.20. After the initial filtering operations (including high-pass filtering (HPF) and sensor compensation filtering (SCF)), a phase calibration filter 24 may receive the filtered current signal $DI'(\theta)$ and filtered voltage signal DV' to compensate for the transformer-caused phase offset $\theta$ between the current and voltage signals prior to computing active and reactive powers. The phase calibration filter 24 removes the phase offset in current to generate calibrated current and voltage signals DI" and DV". The phase calibration filter 24 is usually an all-pass filter that requires complex computation.

Therefore, there is a need for a device and method that measures active and reactive powers without the complex computation associated with calibrating the phase offsets of the current signal. Thus, it is an objective of the present invention to measure active and reactive powers without performing the complex phase calibration filtering on the current signal. It is also an objective of the present invention to directly compute active and reactive powers using un-calibrated current and voltage signals and thereafter to calibrate a phase offset on the computed active and reactive powers.

Embodiments of the present invention may include a method for measuring active and reactive powers of an alternating current. The method may further include receiving a first signal representing a current and a second signal representing a voltage, in which the current includes a phase offset with respect to the voltage, calculating an active power and reactive power based on the first and second signals, and calibrating the calculated active and reactive powers with respect to the phase offset using first and second constants, in which the first and second constants respectively correspond to a sine value and a cosine value of the phase offset.

Embodiments of the present invention may include a device measuring active and reactive powers of an alternating current. The device may include a processor that is configured to receive a first signal representing a current and a second signal representing a voltage, in which the current includes a phase offset with respect to the voltage, calculate an active power and reactive power based on the first and second signals, and calibrate the calculated active and reactive powers with respect to the phase offset using first and second constants, in which the first and second constants respectively correspond to a sine value and a cosine value of the phase offset.

Figure 3:
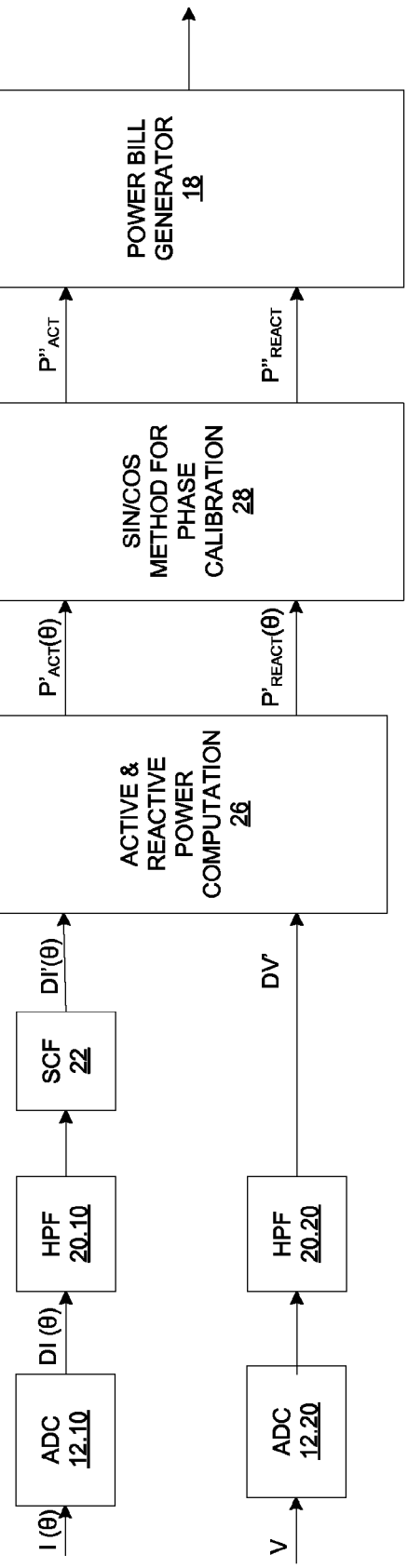
FIG. 3 illustrates a meter channel for measuring active and reactive powers according to an exemplary embodiment of the present invention.

FIG. 3 illustrates a channel for measuring power consumption according to an exemplary embodiment of the present invention. Similar to FIG. 2, the channel may include a first signal path for receiving the current measurement and a second signal path for receiving the voltage measurement where the current measurement include a transformer-caused phase offset of θ from the current. The first signal path may include an ADC 12.10, a high-pass filter 20.10, and a sensor compensation filter 22 that are serially connected, and the second signal path may include an ADC 12.20 and a high-pass filter 20.20. In the first signal path, ADC 12.10 may convert a current input I(θ) into a digital current signal DI(θ) which may be filtered by the high-pass filter 20 and the sensor compensation filter 22 to generate a filtered current signal DI'(θ). In the second signal path, ADC 12.20 may convert an voltage input V into a digital voltage signal DV which may be filtered by a high-pass filter 20.20 to generate a filtered voltage signal DV'. The channel may further include an active and reactive powers computation module 26 for receiving at inputs the filtered current DI'(θ) and voltage signals DV' based on which the active and reactive powers computation module 26 may compute an active power $P'_{ACT}(\theta)$ and a reactive power $P'_{REACT}(\theta)$ as outputs. The active and reactive powers computation module may be one that is known by a person of ordinary skill in the art. For example, the co-pending U.S. patent application Ser. No. 12/335,030 (the content of which is incorporated by reference in its entirety) assigned to the same assignee of the present application describes in detail devices and methods for measuring active and reactive powers. Since the input current and voltage signals include the phase offset θ, the computed active and reactive powers $P'_{ACT}(\theta)$ and $P'_{REACT}(\theta)$ may include the effect of the phase offset θ.

To compensate for the effect of the transformer-caused phase offset θ in active and reactive powers, the meter channel may further include a calibration module 28 that may receive the computed active and reactive powers $P'_{ACT}(\theta)$ and $P'_{REACT}(\theta)$ and remove the effect of the phase offset θ from the computed active and reactive powers to generate calibrated active power $P''_{ACT}$ and calibrated reactive power $P''_{REACT}$. Finally, the meter channel may include power bill generation module 18 that may generate a power bill to the customer based on the calibrated active and reactive powers $P''_{ACT}$, $P''_{REACT}$.

The power calibration may be achieved by mixing orthogonal sinusoid signals with the computed active and reactive powers $P'_{ACT}(\theta)$ and $P'_{REACT}(\theta)$ as discussed in detail in the following. Without concerning the offset caused by current transformers, the voltage and current of a meter channel may be written, in time domain, as:

$$v(t) = \sum_{k=1}^{\infty} V_k \cos(k\omega t), \text{ and } i(t) = \sum_{k=1}^{\infty} I_k \sin(kwt - \phi_k),$$

where t represents time, k represents the $k^{th}$ harmonic (including fundamental frequency when k=1), $V_k$ and $I_k$ are voltage and current amplitudes for the $k^{th}$ harmonic, ω represents frequency, and $\phi_k$ represents the intrinsic phase differences between voltage and current at the $k^{th}$ harmonic. The active and reactive power may be computed from v(t) and i(t) such that the active power $$P = \sum_{k=1}^{\infty} V_k I_k \cos(\phi_k)$$

and reactive power $$Q = \sum_{k=1}^{\infty} V_k I_k \sin(\phi_k).$$

However, when considering the additional delay caused by current transformers in transmission lines, $$v(t) = \sum_{k=1}^{\infty} V_k \cos(k\omega t), \text{ and } i'(t) = \sum_{k=1}^{\infty} I_k \sin(kwt - \phi_k - \theta).$$

Thus, the current i'(t) may include a phase offset θ that is assumed constant (or substantially constant) at different harmonics. Without a pre-calibration of the phase offset for the current, the computed active power $$P'(\theta) = \sum_{k=1}^{\infty} V_k I_k \cos(\phi_k + \theta)$$

and computed reactive power $$Q'(\theta) = \sum_{k=1}^{\infty} V_k I_k \sin(\phi_k + \theta),$$

which both include the effect of the phase offset θ caused by current transformers.

The effect of the phase offset θ caused by current transformers in the computed active and reactive powers may be removed by mixing the computed active and reactive powers with constant values of sin(θ) and cos(θ) as described in the following:

$$P'' = P'\cos(-\theta) - Q'\sin(-\theta) =$$

$$\sum_{k=1}^{N} V_k I_k [\cos(\phi_k + \theta) * \cos(-\theta) - \sin(\phi_k + \theta) * \sin(-\theta)] =$$

$$\sum_{k=1}^{N} V_k I_k \cos(\phi_k)$$

$$Q'' = P'\sin(-\theta) + Q'\cos(-\theta) =$$

$$\sum_{k=1}^{N} V_k I_k [\cos(\phi_k + \theta) * \sin(-\theta) - \sin(\phi_k + \theta) * \cos(-\theta)] =$$

$$\sum_{k=1}^{N} V_k I_k \sin(\phi_k)$$

Thus, after the calibration for active and reactive powers, the effect of phase offsets θ caused by current transformers in the transmission lines may be removed from the computed active and reactive powers P'(θ) and Q'(θ). One advantageous aspect of the present invention is that all harmonic powers are compensated equally.

Figure 4:
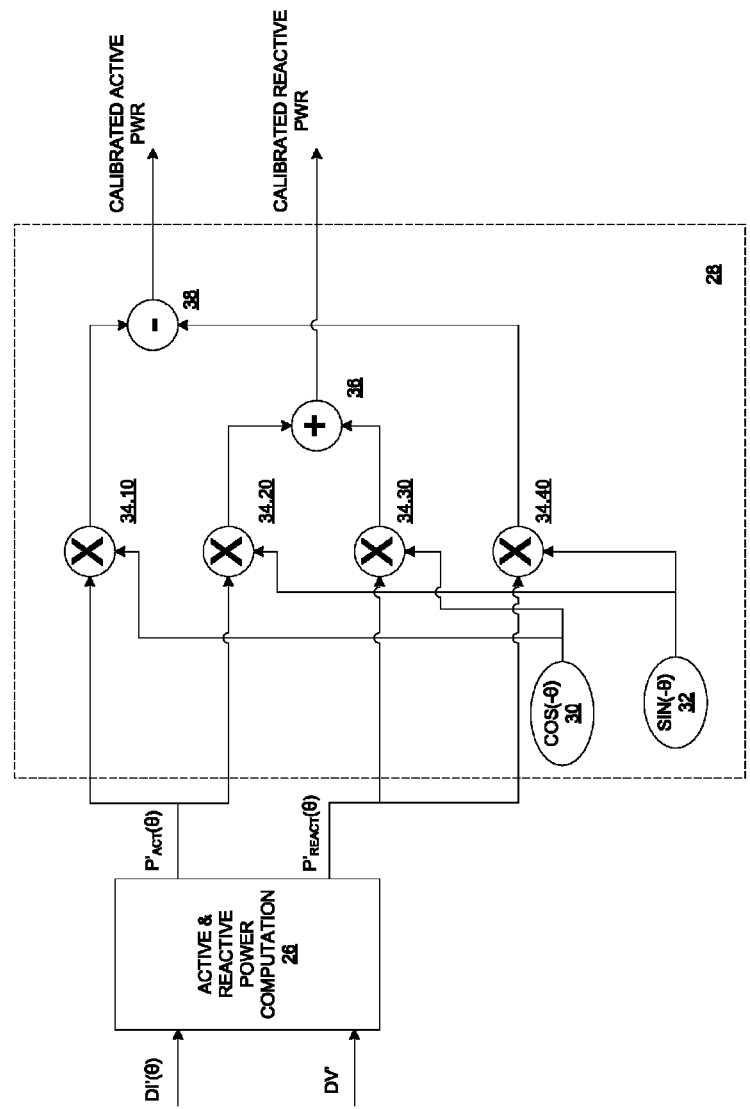
FIG. 4 illustrates a calibration module for calibrating active and reactive powers according to an exemplary embodiment of the present invention.

FIG. 4 illustrates a calibration module for calibrating active and reactive powers according to an exemplary embodiment of the present invention. The calibration module 28 corresponds to the same labeled module as shown in the context of FIG. 3. As shown in FIG. 4, the calibration module 28 may include a pair of constants 30, 32, a plurality of multipliers 34.10 to 34.40, an adder 36, and a subtractor 38. In this embodiment, the constant 30 is a cosine value of the phase offset θ, and the constant 32 is a sine value of the phase offset θ. The constants 30, 32 may be the same constants for different harmonics. The calibration module 28 may receive at a first input active power P'(θ) and at a second input reactive power Q'(θ), where each of the active power P'(θ) and the reactive power Q'(θ) includes effects of phase offset θ caused by current transformers. The first multiplier 34.10 may receive the active power P'(θ) and the first constant cos(−θ) to generate a product of P'(θ)*cos(−θ); the second multiplier 34.20 may receive the active power P'(θ) and the second constant sin(−θ) to generate a product of P'(θ)*sin(−θ); the third multiplier 34.30 may receive the reactive power Q'(θ) and the first constant cos(−θ) to generate a product of Q'(θ)*cos(−θ); the fourth multiplier 34.40 may receive the reactive power Q'(θ) and the second constant sin(−θ) to generate a product of Q'(θ)*sin(−θ). The subtractor 38 may subtract the product of the fourth multiplier 34.40 from the product of the first multiplier 34.10 to obtain the calibrated active power of P"=P'(θ)*cos(−θ)−Q'(θ)*sin(−θ), and the adder 36 may add the product of the second multiplier 34.20 and the product of the third multiplier 34.30 to obtain the calibrated reactive power Q"=P'(θ)*sin(−θ)+Q'(θ)*cos(−θ). As discussed above, the calibrated active power P" and the calibrated reactive power Q" is substantially free of the effect of phase offset θ.

In one embodiment, the phase offsets of the constants 30, 32 may be predetermined based on expected delays caused by current transformers in the transmission lines. The predetermined phase offsets may be pre-calculated and stored in a storage device such as a memory. For example, the predetermined phase offsets may be stored as a stable. In an alternative embodiment, the phase offsets of the constants 30, 32 may be determined in real time based on the delays existing in the transmission lines during operation.

Figure 5:
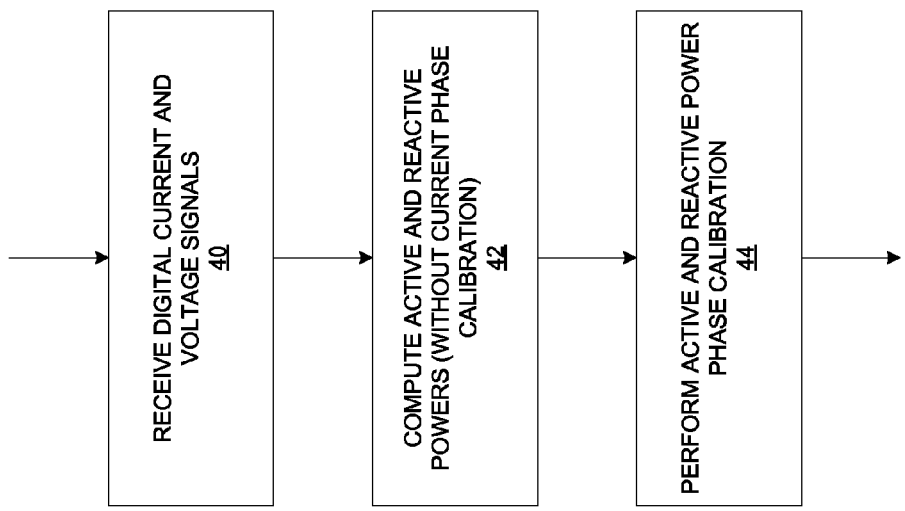
FIG. 5 illustrates a method for measuring active and reactive powers according to an exemplary embodiment of the present invention.

FIG. 5 illustrates a method for measuring active and reactive powers according to an exemplary embodiment of the present invention. A processor such as a DSP may be configured to perform the method. As shown in FIG. 5, at 40, the processor may receive digitized signals DI corresponding to current I and DV corresponding to voltage V, where DI and DV may include a phase offset θ between DI and DV. Without calibrating the phase offset θ between DI and DV, at 42, the processor may be configured to calculate active and reactive powers which may include the effects of the phase offset θ between DI and DV. At 44, the processor may be configured to perform phase calibration on the calculated active and reactive powers as described in conjunction with FIGS. 3 and 4 to remove the effect of phase offset θ between DI and DV. The calibrated active and reactive powers may be used to generate a power bill to the customer.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, and specification.

What is claimed is:

1. A method for measuring active and reactive powers of an alternating current, comprising:

receiving, by a processor, a first signal and a second signal, wherein the first signal is based on a measurement of a current from an at least one electronic measuring instrument and the second signal is based on a measurement of a voltage from the at least one electronic', measuring instrument, and wherein the current includes a phase offset with respect to the voltage;

calculating, by the processor, an active power and reactive power based on the first and second signals; and calibrating, by the processor, the calculated active and reactive, powers by first and second constants to reduce the phase offset, the calibrating including:

multiplying the calculated active power with the first constant to produce a first product;

multiplying the calculated active power with the second constant to produce a second product;

multiplying the calculated reactive power with the first constant to produce a third product:

multiplying the calculated reactive power with the second constant to produce a fourth product;

subtracting the fourth product from the first product to obtain a calibrated active power; and adding the second and third products to obtain a calibrated reactive power, wherein the first and second signals include the phase offset, and wherein the first and second constants respectively correspond to a cosine value and a sine value of the phase offset.

2. The method of claim 1, further comprising generating a power bill to a customer based on the calibrated active power and the calibrated reactive power.

3. The method of claim 1, wherein the phase offset is caused by current transformers in current transmission lines.

4. The method of claim 1, wherein the phase offset is substantially constant over different harmonics.

5. The method of claim 1, further comprising:

converting by a first analog-to-digital converter a current measurement of the alternating current, from the at least one electronic measuring instrument, to the first signal; and converting by a second analog-to-digital converter a voltage measurement of the alternating current, from the at least one electronic measuring instrument, to the second signal.

6. The method of claim 1, wherein the phase offset is reduced until the phase offset is removed.

7. The method of claim 1, wherein the first signal is generated by applying, serially, the measurement of the current to at least one of: an analog to digital converter, a high pass filter, and a sensor compensation filer.

8. The method of claim 1, wherein the second signal is generated by applying, serially, the measurement of the voltage to at least one of: an analog to digital converter and a high pass filter.

9. A device for measuring active and reactive powers of an alternating current, cornprising:

a processor configured to:
  receive a first signal and a second signal, wherein the first signal is based on a measurement of a current from an at least one electronic measuring instrument and the second signal is based on a measurement of a voltage from the at least one electronic measuring instrument, and wherein the current includes a phase offset with respect to the voltage;
  calculate an active power and reactive power based on the first and second signals; and
  calibrate the calculated active and reactive powers by applying first and second constants to reduce the phase offset,
  wherein the first and second constants respectively correspond to a cosine value and a sine value of the phase offset,
  wherein for calibrating, the processor is further configured to:
    multiply the calculated active power with the first constant to produce a first product;
    multiply the calculated active power with the second constant to produce a second product;
    multiply the calculated reactive power with the first constant to produce a third product;
    multiply the calculated reactive power with the second constant to produce a fourth product;
    subtract the fourth product from the first product to obtain a calibrated active power; and
    add the second and third products to obtain a calibrated reactive power, wherein the first and second signals include the phase offset.

10. The device of claim 9, wherein the processor is further configured to generate a power bill to a customer based on the calibrated active power and the calibrated reactive power.

11. The device of claim 9, wherein the phase offset 18 is caused by current transformers in current transmission lines.

12. The device of claim 9, wherein the phase offset is substantially constant over different harmonics.

13. The device of claim 9, further comprising:
  a first analog-to-digital converter for converting a current measurement of the alternating current, from the at least one electronic measuring instrument, to the first signal; and
  a second analog-to-digital converter for converting a voltage measurement of the alternating current, from the at least one electronic measuring instrument, to the second signal.

14. The device of claim 9, wherein the phase offset is reduced until the phase offset is removed.

15. The device of claim 9, wherein the first signal results from serial application of the measurement of the current to at least one of: an analog to digital converter, a high pass filter, and a sensor compensation filer.

16. The device of claim 9, wherein the second signal results from serial application of the measurement of the voltage to at least one of: an analog to digital converter and a high pass filter.

17. A machine-readable non-transitory medium having stored thereon instructions adapted to be executed by a processor to perform a method for measuring active and reactive powers of an alternating current, the method comprising:
  receiving a first signal and a second signal, wherein the first signal is based on a measurement of a current from an at least one electronic measuring instrument and the second signal is based on a measurement of a voltage from the at least one electronic measuring instrument, and wherein the current includes a phase offset with respect to the voltage;
  calculating an active power and reactive power based on the first and second signals; and
  calibrating the calculated active and reactive powers by applying first and second constants to reduce the phase offset, the calibrating further including:
    multiplying the calculated active power with the first constant to produce a first product;
    multiplying the calculated active power with the second constant to produce a second product;
    multiplying the calculated reactive power with the first constant to produce a third product;
    multiplying the calculated reactive power with the second constant to produce a fourth product;
    subtracting the fourth product from the first product to obtain a calibrated active power; and
    adding the second and third products to obtain a calibrated reactive power, wherein the first and second signals include the phase offset.

18. The machine-readable non-transitor medium of claim 17, wherein the phase offset is reduced unth the phase offset is removed.

19. The machine-readable non-transitor medium of claim 17, wherein the first signal is generated by applying, serially, the measurement of the current to at least one of: an analog to digital converter, a high pass filter, and a sensor compensation filer.

20. The machine-readable non-transitory medium of claim 17, wherein the second signal is generated by applying, serially, the measurement of the voltage to at least one of: an analog to digital converter and a high pass filter.

* * * * *